United States Patent [19]

Imai et al.

[11] Patent Number: 5,633,211
[45] Date of Patent: May 27, 1997

[54] SEMICONDUCTOR DEVICE AND PROCESS

[75] Inventors: Shinichi Imai; Yuka Terai; Masanori Fukumoto; Kousaku Yano; Hiroyuki Umimoto; Shinji Odanaka; Yasuo Mizuno, all of Osaka, Japan

[73] Assignee: Matsushita Electric Industrial Co., Ld., Osaka, Japan

[21] Appl. No.: 347,114

[22] Filed: Nov. 23, 1994

Related U.S. Application Data

[62] Division of Ser. No. 37,450, Mar. 26, 1993, abandoned.

[30] Foreign Application Priority Data

Mar. 27, 1992 [JP] Japan ................................ 4-070753
Apr. 15, 1992 [JP] Japan ................................ 4-095040

[51] Int. Cl.$^6$ ................................................... H01L 21/02
[52] U.S. Cl. ........................... 438/760; 438/783; 438/787
[58] Field of Search ................................. 437/225, 238, 437/240, 235

[56] References Cited

U.S. PATENT DOCUMENTS

| | | | |
|---|---|---|---|
| 4,349,584 | 9/1982 | Flatley et al. | 427/85 |
| 4,810,673 | 3/1989 | Freeman | 437/238 |
| 4,962,063 | 10/1990 | Maydan et al. | 437/228 |
| 5,068,697 | 11/1991 | Noda et al. | 257/650 |
| 5,130,782 | 7/1992 | Ashwell | 257/650 |
| 5,180,692 | 1/1993 | Ibuka et al. | 437/238 |
| 5,215,787 | 6/1993 | Homma | 427/248.1 |
| 5,250,473 | 10/1993 | Smits | 437/238 |
| 5,290,736 | 3/1994 | Sato et al. | 437/238 |
| 5,302,548 | 4/1994 | Watanabe et al. | 437/225 |
| 5,314,845 | 5/1994 | Lee et al. | 437/235 |
| 5,314,848 | 5/1994 | Yasui et al. | 437/248 |
| 5,334,552 | 8/1994 | Homma | 437/238 |
| 5,413,967 | 5/1995 | Matsuda et al. | 437/238 |

FOREIGN PATENT DOCUMENTS

| | | | |
|---|---|---|---|
| 2524750 | 12/1975 | Germany | 257/650 |
| 0743330 | 6/1989 | Japan | 437/240 |
| 53163 | 1/1993 | Japan . | |

OTHER PUBLICATIONS

Watanabe et al., "The Properties of LPCVD $SiO_2$ Film Deposited by $SiH_2 Cl_2$ and $N_2O$ Mixtures"; J. Electrochem. Soc., Solid State Science and Technology; vol. 128, No. 12, 1981, pp. 2630–2635.

*Primary Examiner*—Trung Dang
*Attorney, Agent, or Firm*—McDermott, Will & Emery

[57] ABSTRACT

The characteristic of semiconductor devices is satisfactorily maintained because the planarization of a dielectric film of a semiconductor device is carried out at a lower flow temperature. In the case of a silicon dioxide film being a dielectric film, a network structure is composed of atoms of silicon which serve as a main constituent, and of atoms of oxygen which serve as a sub-constituent of a matrix of the dielectric film. These oxygen atoms are replaced by non-bridging constituents such as atoms of halogen including fluorine. This breaks a bridge, via an oxygen atom, between the silicon atoms, at a position where such a replacement takes place. In consequence, the viscosity of the dielectric film falls with the flow temperature. If, for example, part of the oxygen in a BPSG film is substituted by fluorine, this allows the dielectric film to flow at a lower temperature of 850° C. The short channel effects can be suppressed.

14 Claims, 7 Drawing Sheets

SEMICONDUCTOR DEVICE AND PROCESS

This is a divisional of application Ser. No. 08/037,450, filed Mar. 26, 1993 now abandoned.

FIELD OF THE INVENTION

This invention relates to a semiconductor device having a dielectric film or layer on a semiconductor substrate, and further to a process of fabricating the semiconductor device. More particularly, it pertains to a process in order for a dielectric film to flow at a lower temperature.

BACKGROUND OF THE INVENTION

The semiconductor industry is continuously trying to increase the density of devices by means of recent state-of-the-art semiconductor device processing techniques. Of all the techniques, deposition and planarization processes of dielectric films including interlayer dielectric films have lately attracted considerable attention and are expected to play an important role in the semiconductor industry in the future to come. Quality semiconductor devices much depend upon the planarization process. Generally, semiconductor devices have many layers. As semiconductor device dimensions are reduced to submicron regions, upper layer formation is strongly effected by the undulation of a lower layer. The degree of the planarization increasingly becomes important and the thermal burden, which is known as the thermal budget in the art, increases in order to planarize a dielectric film. But thermal processes influence on the transistor and deteriorate the device characteristics. On the other hand, such a thermal budget of processing must be reduced to suppress the short-channel effects in the transistor.

With a view to reducing the budget mentioned above, chemical vapor deposition (CVD) process is commonly used to deposit a film of phosphorus-doped silicon dioxide (i.e., phosphosilicon-glass, PSG) or a film of boron-and-phosphorus-doped silicon dioxide (i.e., borophosphosilicate glass, BPSG). A film of PSG flows at about 950° C. A BPSG film as an interlayer dielectric film, when subjected to thermal processing at a low temperature, say about 900° C., flows for its planarization.

If the deposition of dielectric films, formed by an impurity-doped silicate glass such as PSG, BPG, BPSG and AsSG, is carried out by means of a conventional CVD process, their respective hydrides, chlorides, and organic compounds such as alkoxide are introduced (see Table). Silicate glass finds its use in semiconductor devices recently.

TABLE

| Source | Compounds |
| --- | --- |
| 1. Phosphorus | $PH_3$, $POCl_3$, $PCl_3$, $PO(OCH_3)_3$, $PO(OC_2H_5)_3$, $P(OCH_3)_3$, $P(OC_2H_5)_3$ $PO(CH_3)_3$, $P(CH_3)_3$ |
| 2. Boron | $B_2H_6$, $BCl_3$, $B(OCH_3)_3$, $B(OC_2H_5)_3$, $B(CH_3)_3$, $B(C_2H_5)_3$ |
| 3. Arsenic | $AsH_3$, $As(OCH_3)_3$, $As(CH_3)_3$ |

An example is given to describe a conventional semiconductor device and its fabrication process, with the help of the appended drawings. FIG. 8 locally illustrates, in cross section, a conventional semiconductor device. A semiconductor substrate is indicated by reference numeral 1, a switching transistor by reference numeral 2, a silicon dioxide film by reference numeral 3, a BPSG film, which is deposited onto the silicon dioxide film 3, by reference numeral 6, and an aluminum wiring by reference numeral 8, a polycrystalline silicon as a drain or a source electrode by reference 11, and an n-type impurity by reference numeral 12.

The BPSG 6 film is deposited, through a CVD process, onto the silicon substrate 1 by making use of a source gas formed by doping TEOS (tetra-ethyl-ortho-silicate, $Si(OC_2H_5)_4$), $SiH_4$ (monosilane gas), and the like for forming a silicon dioxide film (i.e., a matrix), with phosphorus and boron sources. When subjected to thermal processing at a temperature of about 900° C., the BPSG film 6 is planarized with a smooth flow shape.

FIG. 9 is a diagram outlining a conventional deposition of a film of BPSG. As shown in the figure, $SiH_4$, $B_2H_6$, $PH_3$, and $O_2$ are used as a source gas while $N_2$ is used as a carrier gas. These gases are introduced into a reaction chamber 10 to deposit the BPSG film 6 onto the silicon substrate 1. Here, an atmospheric pressure CVD system is employed. Then the silicon substrate 1 is heated to somewhere between 350° and 450° C. The deposited BPSG film 6 is placed inside an electric furnace, being subjected to thermal processing for about 30 minutes at about 900° C. in an atmosphere of nitrogen. The BPSG film 6 flows upon heating. At this point in time, the flow angle θ of the BPSG film 6 must be about 30 or less degrees for the planarization thereof to be done.

FIG. 10 Illustrates an internal structure of the post-flow BPSG film 6 formed by the above processing. The BPSG film 6 is here shown in plane for the sake of simplification but actually has a 3-D network structure formed by the $B_2O_3$-$P_2O_5$-$SiO_2$ bond. More specifically, the atom of silicon serves as a main constituent, whereas the atom of oxygen serves as a sub-constituent which forms a bond at the tetrahedron position of the silicon atom. Both the main and sub-constituents bond together in a network fashion to form a matrix of silicate glass. Such a network matrix has a structure in which phosphorus and boron atoms replaces a silicon atom.

The increased density of semiconductor devices involves a risk of the short-channel effects. In order to suppress the unwanted short-channel effects, a film of BPSG must undergoes thermal processing at temperatures lower than 900° C. If, however, the thermal processing is carried out at below 900° C., the degree of planarization will get worse because the BPSG film does not flow sufficiently. This is explained by the fact that the flow angle θ of the BPSG film varies with the thermal processing temperature. In other words, the flow angle increases as the thermal processing temperature decreases.

There are two processes known in the art in order to achieve lower-temperature thermal processing of dielectric films such as a BPSG film while still keeping the flow angle as small as about 30 degrees.

(Method I)

In accordance with this method, thermal processing is carried out in an atmosphere of high-pressurized hot air or in an atmosphere of water vapor, in order to reduce the flow angle θ.

(Method II)

In this method, the dose of impurities such as phosphorus, boron and arsenic into a dielectric film is increased to reduce the flow angle θ.

The Method I, however, requires the provision of an anti-oxidizing dielectric film formed by, for example, silicon nitride underneath a film of BPSG to protect a transistor. Those which require many fabrication steps such as DR are unable to take advantage of this method because it is impossible to form a film of silicon nitride. This method is too much limited to be practical.

The Method II, on the other hand, may suffer a risk that precipitated substances are produced, although the degree of planarization can be improved by increasing the concentration of impurities. This means that less impurity dose (phosphorus, boron and the like elements) is preferable. For the case of a BPSG film, it is likely that the atom of boron condense to form a core, the core reacting with a phosphooxide gas given off from the film resulting in the crystal growth of $BPO_4$. This results in the formation of a "bump". The denser the concentration of impurities becomes, the more foreign substances are produced. This arises a problem in a DRAM that its upper-layer bit line or aluminum wiring is likely to be disconnected, which results in poor-quality semiconductor devices.

It has been widely held that to lower the temperature of thermal processing conflicts with the planarization, and that the margin of material has been reached.

SUMMARY OF THE INVENTION

Bearing in mind the foregoing problems, the present invention was made. In accordance with the invention, a matrix in a dielectric film is composed of a main constituent (it is a silicon atom in the foregoing prior art example) and a sub-constituent (an oxygen atom in the example) that forms a bond to the main constituent, and a non-bridging constituent replaces such a sub-constituent, whereby a thermal processing temperature for planarization can be lowered without involving any electrical property deterioration.

To solve the foregoing object, the present invention provides the following respective means.

(1) A first solving means of the invention provides a semiconductor device which comprises a semiconductor substrate and a dielectric film arranged upon the semiconductor substrate. This dielectric film comprises (a) a matrix formed by a main constituent composed of at least one type of chemical element and a sub-constituent composed of at least one type of chemical element, these constituents bonding together in a network fashion and (b) a non-bridging constituent composed of at least one type of non-bridging chemical element which replaces part of the sub-constituent to form a bond to the main constituent thereby breaking part of the matrix network.

In accordance with this solving means, part of the sub-constituent is replaced by the non-bridging constituent whereby the matrix network is partially broken. In consequence, the thermal processing temperature necessary for making the dielectric layer flow drops. Possible ill effects on semiconductor devices are reduced, and thus their reliability is much improved.

(2) A second solving means of the invention provides a semiconductor device dependent on the first solving means which is characterized in that the non-bridging constituent is halogen.

In accordance with this solving means, part of the network is positively broken, since once a chemical element of halogen replaces one sub-constituent in a matrix it will not combine with another any more because of its valence of one.

(3) A third solving means of the invention provides a semiconductor device dependent upon the second solving means which is characterized in that the non-bridging constituent is fluorine.

In accordance with this solving means, fluorine is used, because it, when entering a dielectric film matrix, tends to reduce the viscosity of the film very much during the thermal processing, and performs the function of lowering the temperature of flow. Further, fluorine exhibits little ill-effect on a semiconductor device, and thus the device characteristic can remarkably be improved.

(4) A fourth solving means of the invention provides a semiconductor device dependent upon any of the first to third solving means which is characterized in that the main constituent is composed of a silicon atom; the sub-constituent is composed of an oxygen atom; and the matrix of the dielectric film is composed of a film of silicon dioxide formed by bonds between the silicon atoms and the oxygen atoms In a network fashion.

In accordance with this solving means, the matrix is formed by a film of silicon dioxide because silicon dioxide hardly causes distortion In devices in a semiconductor substrate when brought Into contact with the surface of a device. Additionally, silicon dioxide hardly causes impurity diffusion throughout a device. Thus, the device characteristic is advantageously maintained In a semiconductor substrate.

(5) A fifth solving means of the invention provides a semiconductor device dependent upon the fourth solving means which is characterized in that the silicon atoms in the network are partially replaced by any one of phosphorus atoms, boron atoms and arsenic atoms.

In accordance with these solving means, a phosphorus atom, boron atom, or arsenic atom replaces a silicon atom in a matrix, whereby part of the network where an oxygen atom plays as a bridging atom is broken at a position where such a replacement takes place. Therefore, such a silicon dioxide film, when heated, is going to have a lower viscosity, and thus the temperature of flow falls very much.

(6) A sixth solving means of the invention provides a semiconductor device dependent upon any one of the first to fifth solving means which is characterized in that the dielectric film is an interlayer dielectric film.

In accordance with this solving means, the characteristic of semiconductor devices is much improved by lowering the flow temperature of an interlayer dielectric film, since an interlayer dielectric film, which is used for isolation between electric wiring layers, particularly requires high-level surface planarization.

(7) A seventh solving means of the invention discloses a method of fabricating a semiconductor device comprising a semiconductor substrate, and a dielectric film, having a matrix in a network fashion, arranged upon the semiconductor substrate. This method comprises the steps of (a) depositing, by means of a CVD process making use of a source gas containing as its principal ingredient a gaseous molecule including in its molecular structure (1) a main constituent composed of at least one type of chemical element, (2) a sub-constituent composed of at least one type of chemical element, and (3) a non-bridging constituent composed of at least one type of non-bridging chemical element which replaces part of the sub-constituent to form a direct bond to the main constituent, a solidified substance produced from the source gas onto the semiconductor substrate. (b) subjecting the solidified substance to thermal processing, and (c) depositing on the semiconductor substrate the dielectric film with its matrix network partially broken due to the non-bridging constituent replacing the sub-constituent.

In accordance with this solving means, the source gas self-contains a gaseous molecule as described above, and thus a non-bridging constituent can positively be incorporated into a matrix without creating free atoms or molecules of a non-bridging constituent between matrixes. Accordingly, ill effects on a semiconductor device due to such free non-bridging constituents are well controlled while still achieving a lower flow temperature. (8) An eighth solving means of the invention discloses a method dependent upon the seventh solving means which is characterized in that the step of depositing the solidified substance from the source gas onto the semiconductor substrate and the step of subjecting the thus deposited solidified to the thermal processing are simultaneously carried out.

In accordance with this solving means, processing time can be shortened, since the a solidified substance is being deposited while being heated.

(9) A ninth solving means of the invention discloses a method dependent upon any of the seventh to eighth solving means which is characterized in that the non-bridging constituent is halogen.

In accordance with this solving means, part of the network work is positively broken, since once an element of halogen replaces one sub-constituent it will not form a bond to another element any more because of its valence of one.

(10) A tenth solving means of the invention discloses a method dependent upon the ninth solving means which is characterized in that the principal ingredient of the source gas is chosen from among $SiH_2F_2$, $SiH_2Cl_2$, $SiH_3F$, and $SiH_3Cl$.

In accordance with this solving means, the dielectric film is formed by a source gas having such a molecular structure that some of four hydrogen atoms constituting a monosilane molecule are replaced by halogen. If a dielectric film is formed by such a monosilane gas, this offers good conformal step coverage (uniformity of film thickness) to, such as, an electrode substrate and wiring to be covered. Take, for example, a deep contact hole. Its bottom and sidewall will be covered with a uniform film. (11) An eleventh solving means of the invention discloses a method dependent upon the ninth solving means which is characterized in that the principal ingredient of the source gas is a molecule of a compound that is formulated by: $F-Si-(OC_2H_5)_3$ (i.e., FTES, fluorotriethoxysilane). (12) A twelfth solving means of the invention discloses a method dependent upon the ninth solving means which is characterized in that the source gas is a molecule of a compound that is formulated by: $F_2-Si-(OC_2H_5)_2$.

In accordance with these solving means, the dielectric film is formed by a source gas that has a molecular structure where part of four ethoxyl groups together constituting a molecule of TEOS gas is replaced by fluorine atoms. A TEOS gas gives a better conformal step coverage to a substrate than a monosilane gas does.

(13) A thirteenth solving means of the invention discloses a method dependent upon any of the ninth to twelfth solving means which is characterized in that the source gas is doped either with $SiH_4$ or TEOS as a sub-ingredient.

In accordance with this solving means, the source gas contains either $SiH_4$ or TEOS. Accordingly, a silicon dioxide film (the matrix) is formed rapidly, which leads to the rapid formation of a dielectric film.

(14) A fourteenth solving means of the invention discloses a method dependent upon any of the ninth to thirteenth solving means which is characterized in that the source gas is doped with a phosphorus source gas as a sub-ingredient.

In accordance with these solving means, the dielectric film flows at a much lower temperature. This is because that a phosphorus source gas, boron source gas, or arsenic source gas is added to a source gas to replace a silicon atom (that is, a main constituent) with a phosphorus atom, boron atom, or arsenic atom in a matrix whereby part of the network is broken.

(15) A fifteenth solving means of the invention discloses a method of fabricating a semiconductor device comprising a semiconductor substrate and a dielectric film arranged upon the semiconductor substrate wherein the dielectric film has a matrix in a network fashion formed by a main constituent composed of at least one type of chemical element and a sub-constituent composed of at least one type of chemical element. This method comprises the steps of (a) depositing the dielectric film on the substrate, (b) doping the dielectric film with ions of a non-bridging constituent bondable to the main constituent and composed of at least one type of non-bridging chemical element, and (c) subjecting the doped dielectric film to thermal processing, whereby the dielectric film is deposited, with its matrix network partially broken due to the replacement by the non-bridging constituent.

This solving means enables selective doping so that only a desired region of a matrix in a previously formed dielectric film is doped with ions of a non-bridging constituent, by making use of a mask.

(16) A sixteenth solving means of the invention discloses a method dependent upon the fifteenth solving means which is characterized in that the non-bridging constituent is halogen.

In accordance with this solving means, it is assured that part of the network of the matrix is broken by replacing one sub-constituent in the matrix with halogen having a valence of one.

(17) A seventeenth means of the invention discloses a method dependent upon the sixteenth solving means which is characterized in that the non-bridging constituent is fluorine.

In accordance with this solving means, fluorine is used since it, when entering the matrix of a dielectric film, tends to considerably reduce the viscosity of the film during the thermal processing, and performs the function of lowering the temperature of flow. Further, fluorine exhibits little ill-effect on devices in a semiconductor substrate, and thus the device characteristic can remarkably be improved.

(18) An eighteenth solving means of the invention discloses a method dependent upon any of the fifteenth to seventeenth solving means which is characterized in that the main constituent is composed of a silicon atom; the sub-constituent is composed of an oxygen atom; and the matrix of the dielectric film is composed of a film of silicon dioxide formed by bonds between the silicon atoms and the oxygen atoms in a network fashion.

In accordance with this solving means, the matrix is formed by a film of silicon dioxide. Silicon dioxide hardly causes distortion in devices in a semiconductor substrate when brought into contact with the surface of a device. Additionally, silicon dioxide hardly causes impurity diffusion throughout a device. Thus, the device characteristic is advantageously maintained in a semiconductor substrate.

(19) A nineteenth solving means of the invention discloses a method dependent upon the eighteenth solving means which is characterized in that the step of replacing part of the main constituent of the matrix of the dielectric film with any one of phosphorus atoms, boron atoms, and arsenic atoms is further included.

In accordance with these solving means, a phosphorus atom, boron atom, or arsenic atom replaces a silicon atom in the matrix, whereby part of the network where an oxygen atom plays as a bridging atom is broken at a position where such replacement takes place. Therefore, such a silicon dioxide film, when heated, is going to have a lower viscosity, and thus the temperature of flow falls very much.

(20) A twentieth solving means of the invention discloses a method dependent upon any of the eighth to nineteenth solving means which is characterized In that the dielectric film is an Interlayer dielectric film.

In accordance with this solving means, the characteristic of semiconductor devices is much improved by lowering the flow temperature of a dielectric film, since an interlayer dielectric film, which is used for isolation between electric wiring layers, particularly requires high-level surface planarization.

BRIEF DESCRIPTION OF THE DRAWINGS

Other objects, features, and advantages will become apparent to those who are skilled in the art from the following description when considered In conjunction with the appended claims and drawings, in which:

PREFERRED EMBODIMENTS OF THE INVENTION

FIRST EMBODIMENT

Figure 1:
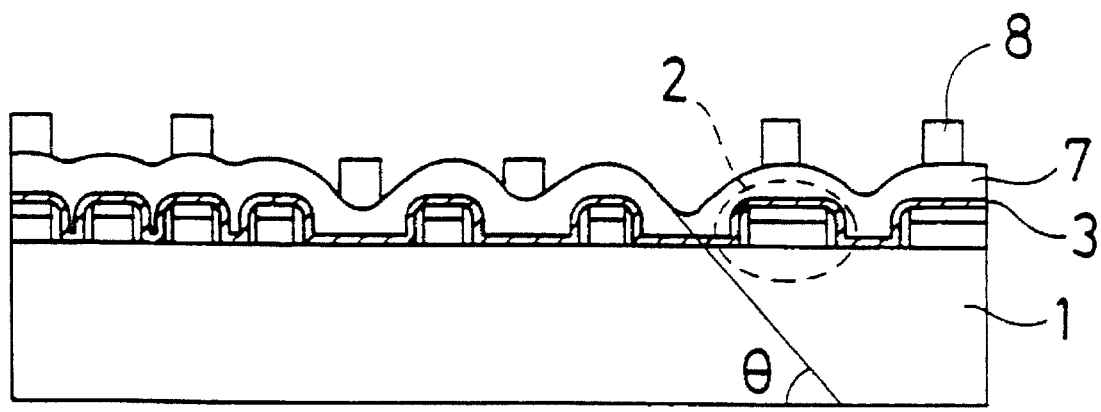
FIG. 1 illustrates the organization of a semiconductor device of a first embodiment of the present invention.

A first embodiment of the present invention is now described by making reference to FIG. 1 that illustrates, in cross section, a semiconductor device of this embodiment. A semiconductor substrate is indicated by reference numeral 1. A switching transistor is indicated by reference numeral 2, which is located nearby the surface of the semiconductor substrate 1. A film of silicon dioxide is indicated by reference numeral 3. A film of FBPSG is indicated by reference numeral 7, which is an interlayer dielectric film formed on the silicon dioxide film 3. An upper-layer aluminum wirings is indicated by reference numeral 8. The FBPSG film 7 is used for electric isolation between the switching transistor 2 and the upper-layer aluminum wiring 8.

A CVD process for forming the FBPSG film 7 is now explained.

Figure 2:
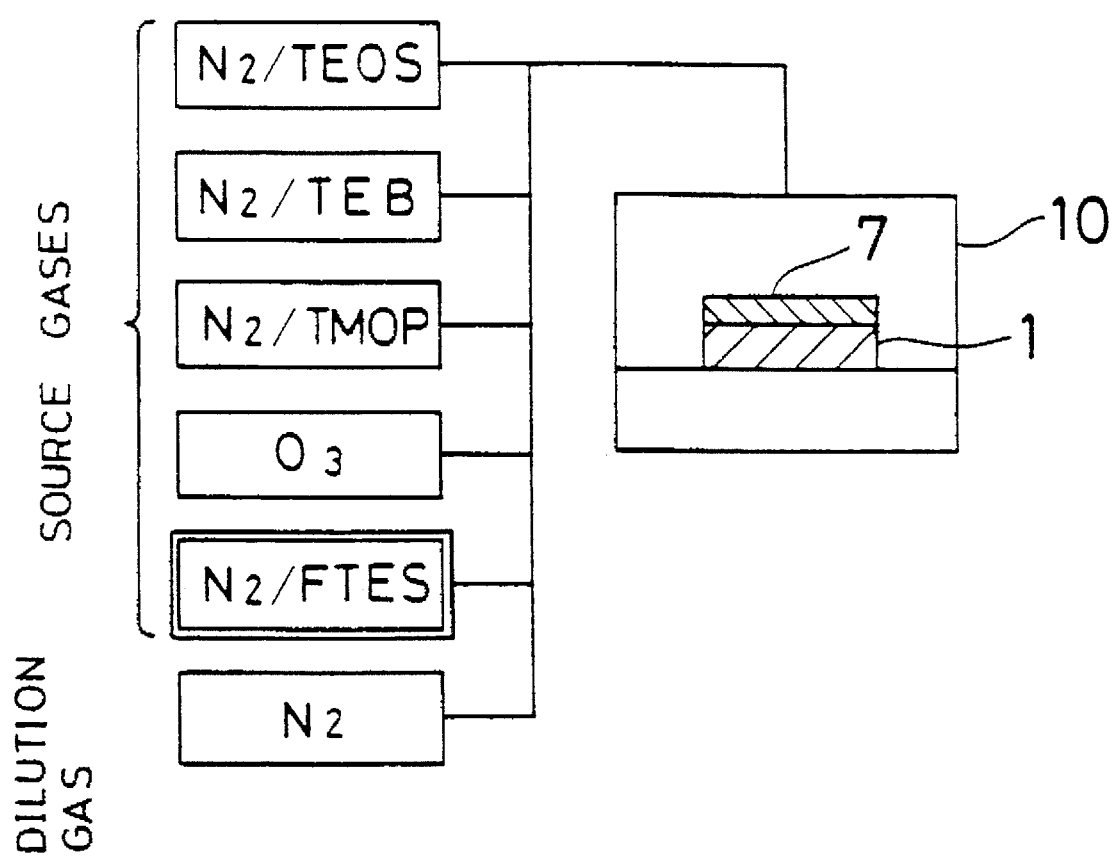
FIG. 2 outlines the organization of a CVD system used to deposit a film of FBPSG of the first embodiment.

FIG. 2 shows how the FBPSG film 7 of this embodiment is deposited. The semiconductor substrate 1, in which a switching transistor is formed, is placed inside a reaction chamber 10 the temperature of which is kept at about 370° C. Then, source gases of TEB and TMOP, along with FTES in place of TEOS which is used In a conventional CVD process, are introduced into the reaction chamber 10. A dilution-and-bubble gas of $N_2$ is also introduced into the reaction chamber 10.

Figure 3:
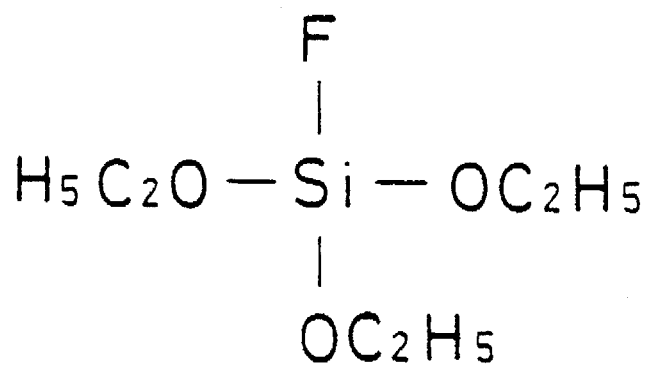
FIG. 3 shows the molecular structure of an FTES source gas of the first embodiment.

FIG. 3 formulates an FTES gas to show its molecular structure. A silicon atom has four bond positions at its tetrahedron, and to three of which $OC_2H_5$ forms a bond while to the remaining a fluorine atom forms a direct bond. In other words, FTES has such a molecular structure where one of the oxygen atoms which bonds to a silicon atom, a main constituent of a matrix of a dielectric film, is replaced by a fluorine atom.

The FBPSG film 7 grows on the semiconductor substrate 1. The gas flow rates of TMOP to FTES, TEB to FTES, and $O_3$ to FTES are 4.5%, 12%, and 5%, respectively.

The deposited FBPSG film 7 is heated at 850° C. for 30 minutes to make it flow for its surface planarization to be done.

The chemical reactions for FTES gas and water vapor are:

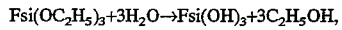

Figure 4:
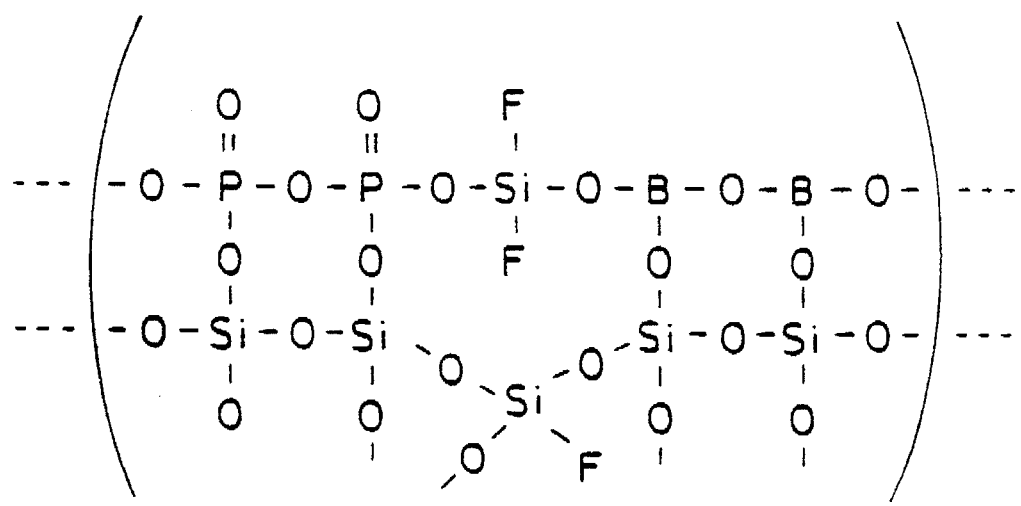
FIG. 4 shows, in plane, the structure of an FBPSG film of the first embodiment.

As a result of the above reactions, the FBPSG film 7 having a structure as shown in FIG. 4 is obtained. More specifically, a matrix is formed by a silicon dioxide film, and a silicon atom (i.e., the main constituent) and an oxygen atom (i.e., the sub-constituent) which bonds to the silicon atom at the tetrahedron position thereof together form a network structure. Part of the oxygen atoms in the matrix is replaced by fluorine atoms which are a non-bridging constituent, and thus such fluorine atoms form direct bonds to the silicon atoms. Fluorine has a valence of one so that its atom does not bond to another different atom but to a corresponding oxygen atom. In consequence, the network structure is partially broken by the fluorine atom.

It is noted that, in this embodiment, part of the silicon atoms which are a main constituent of a matrix is substituted by phosphorus and boron atoms, which means that the matrix itself has a BPSPG film structure. The phosphorus atom functions as an atom with a valence of five on a negative ion so that it double-bonds to the oxygen atom hence part of the matrix network structure is broken by such a phosphorus atom. Although boron has a valence of three so that its atom bonds to three oxygen atoms, part of the matrix network structure is broken by such a boron atom since the matrix is composed of a silicon atom serving as a main constituent having a valence of four.

Figure 5:
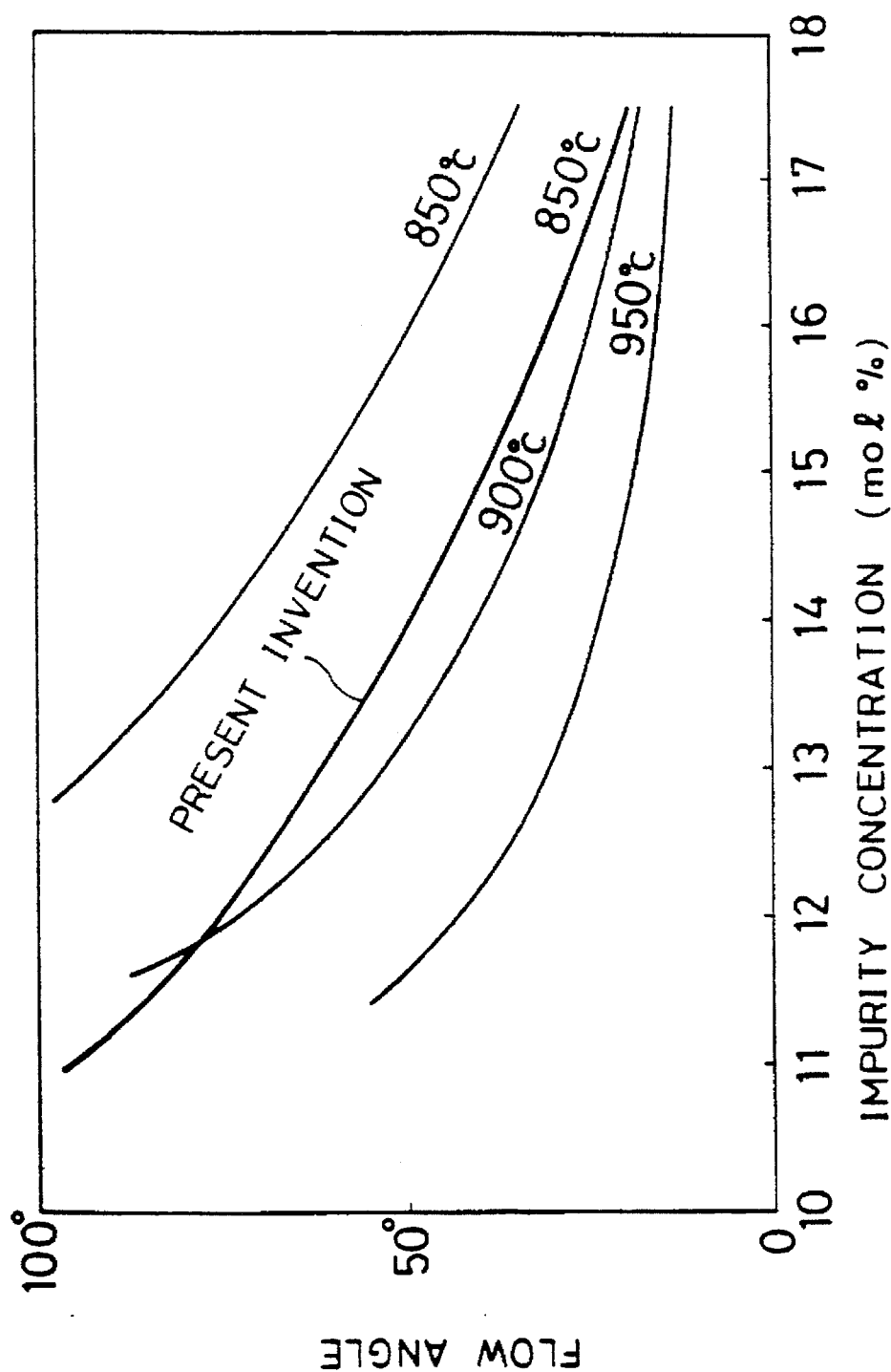
FIG. 5 shows the flow temperature characteristic of a film of FBPSG of the first embodiment.

FIG. 5 shows how the flow angle varies with the impurity concentration (surface height difference: 500 nm) in this embodiment.

For the case of a conventional BPSG film, a flow-shape with a flow angle of 30 degrees is accomplished by carrying out thermal processing at 900° C. for 30 minutes, whereas this embodiment can achieve the same result through thermal processing carried out at a lower temperature of 850 ° C. for 30 minutes.

As shown in FIG. 4, a fluorine atom which is a non-bridging constituent replaces an oxygen atom to form a direct bond to a silicon atom which is a main constituent. This prevents one silicon atom from establishing a cross-link, via an oxygen atom, with another silicon atom. The disconnection of the network structure due to a fluorine atom results in the decrease in the number of network bonds. The viscosity of the FBPSG film 7 of a dielectric film falls. This allows the FBPSG film 7 to flow at a lower thermal processing temperature. To sum up, the dielectric film planarization can be accomplished while controlling possible ill effects on the switching transistor 2 due to high-temperature thermal processing, such as the short channel effects.

In the case that halogen including fluorine, chlorine, bromine, and iodine having a valence of one is used as a non-bridging constituent, once a direct bond of a halogen atom to a silicon atom is complete it will form no further bonds to another atom. Thus, the number of network structure bonds is reduced. Fluorine has several advantages, some of which are that it works to positively get the viscosity of a silicon dioxide film lowered, and that it has little ill effect on semiconductor devices. By making use of a fluorine atom as a non-bridging constituent, many advantages can be obtained.

In the case of a matrix of a dielectric film formed by a silicon dioxide film, it is possible to obtain a much lower flow temperature by introducing a non-bridging constituent such as a fluorine atom into any of a PSG film (phosphorus-doped silicon dioxide), BSG film (boron-doped silicon dioxide), AsSG film (arsenic-doped silicon dioxide), and BPSG film (boron-and-phosphorus-doped silicon dioxide). For the case of a BPSG film, a silicon atom serving as a matrix main constituent is replaced by, for example, phosphorus thereby breaking part of the matrix network structure. As a result, a lower flow temperature can be obtained as compared to a case that the matrix is composed of a silicon dioxide film alone. It, however, is noted that there is an upper limitation to the dose of phosphorus and boron so as to avoid a risk that precipitated substances, which have ill effects on the characteristic of semiconductor devices, are produced. For the case of a conventional BPSG film, if nearly the same flow-shape as obtained by thermal processing at a temperature of 900° C. is required to be achieved by thermal processing at a lower temperature of 850° C., the concentration of $B_2O_3$ must be in excess of 12mol%. If, however, the concentration of $B_2O_3$ goes beyond that, a few thousands of foreign substances with a diameter greater than 0.5 μm will deposit. Such is not suitable for the fabrication of semiconductor devices.

In accordance with this embodiment, fluorine is introduced into a BPSG film. Because of this, thermal processing at a temperature of 850° C. achieves nearly the same flow-shape that thermal processing at 900° C. does, even if the concentration of $B_2O_3$ is 9 mol %. Further, the increase of the dose of fluorine will produce no unwanted precipitated substances, whereby the flow temperature of a BPSG film can be lowered from about 900° C. (conventional lower-limit) down to somewhere around 850° C.

In this embodiment, an FTES gas is used, the molecule of which contains both the main and sub-constituents of the matrix of the dielectric film, but with part of the latter replaced by the non-bridging constituent. The Si—F bond therefore becomes incorporated into the dielectric film. Free atoms and molecules of the non-bridging constituent which have not been incorporated into the matrix are nearly nonexistent in the dielectric film, accordingly. Semiconductor devices of this embodiment are free from ill effects due to such free atoms and molecules.

The source gas is not limited only to the foregoing FTES gas, of the TEOS family, formed by substituting one of the four ethoxyl groups constituting TEOS with a fluorine atom. A gas with a structure of $F_2$—Si—$(OC_2H_5)$ (that is, a gas formed by replacing two of the four ethoxyl groups of TEOS with a fluorine atom) may be employed. Other feasible source gases are monosilane gases such as $SiH_2F_2$, $SiH_2Cl_2$, $SiH_3F$, $SiH_3Cl$, and the like formed by substituting a hydrogen atom with a halogen atom. Monosilane and TEOS gases offer a good step coverage at a sharp drop. It has been confirmed that a TEOS gas particularly gives a better conformal step coverage.

SECOND EMBODIMENT

A second embodiment of the invention is explained by reference to FIG. 6 comprised of FIGS. 6(a),(b), and (c).

Figure 6A:
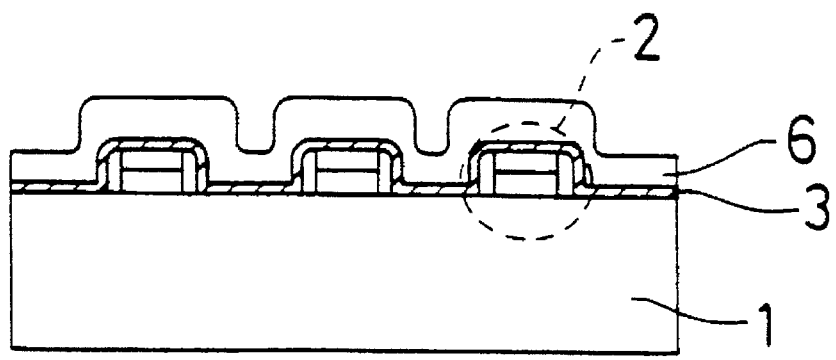
FIGS. 6(a) to 6(c) illustrates the fabrication process of a semiconductor device of a second embodiment of the invention.
Figure 9:
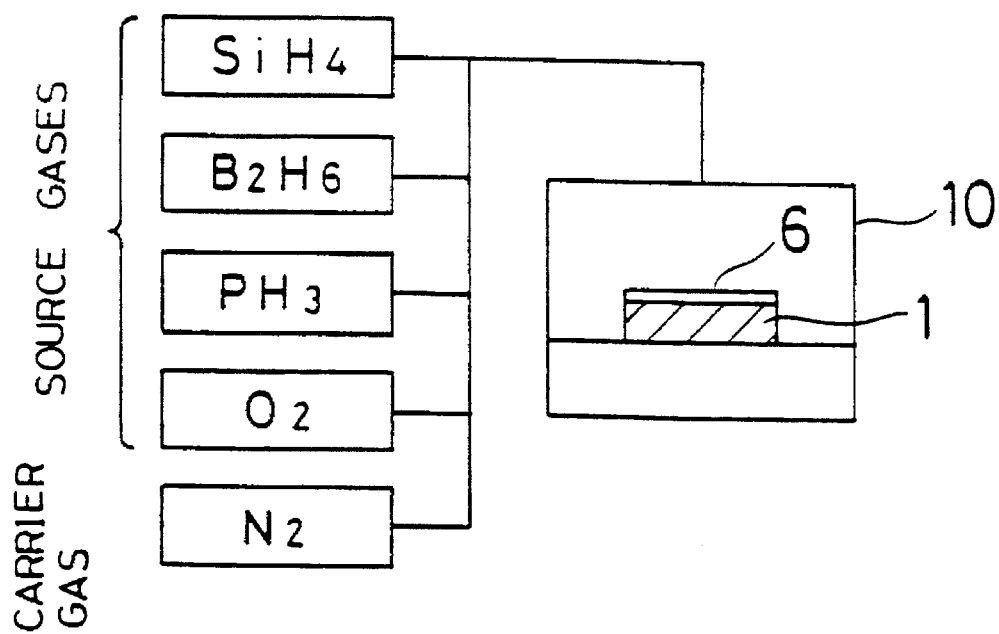
FIG. 9 outlines the organization of a CVD system used to deposit a conventional FBPSG film.
Figure 10:
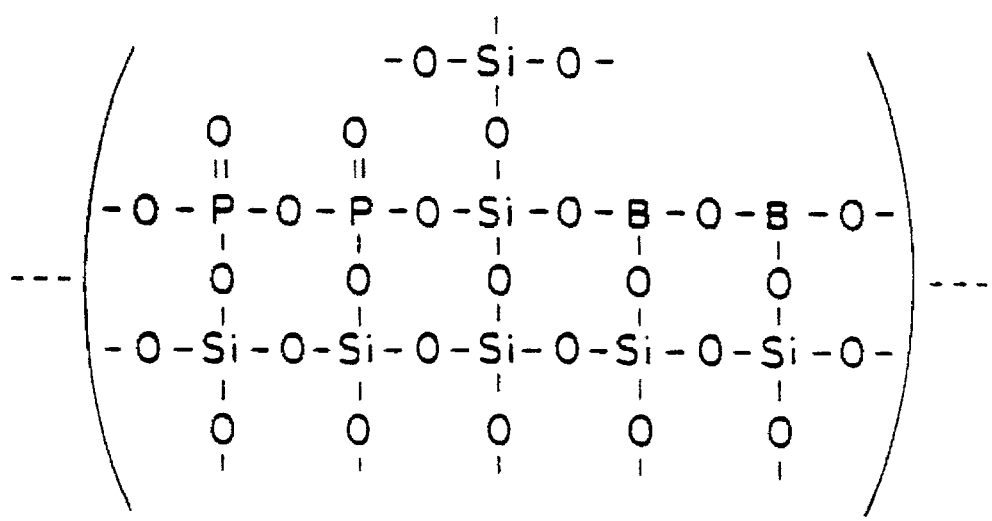
FIG. 10 shows, in plane, the structure of a conventional BPSG film.

As shown in FIG. 6(a), a film of BPSG 6 of an inter-layer dielectric film for a switching transistor 2 to be formed on a silicon substrate 1 is formed by means of a CVD process. This BPSG film 6 is formed through a conventional process (see FIG. 9).

Figure 6B:
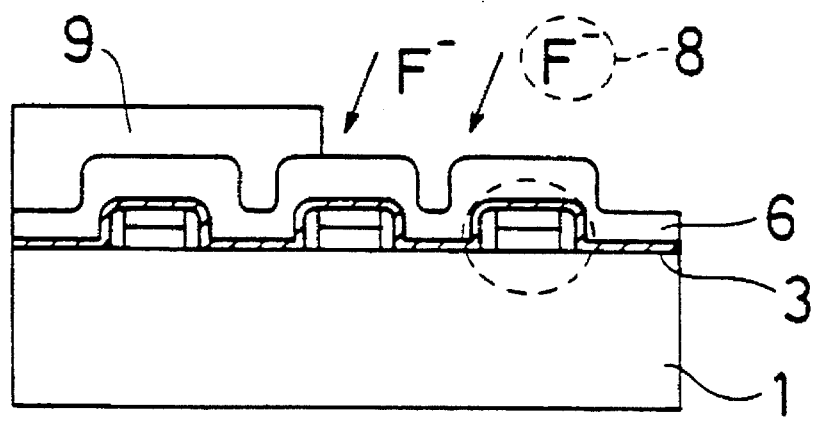
Figure 6C:
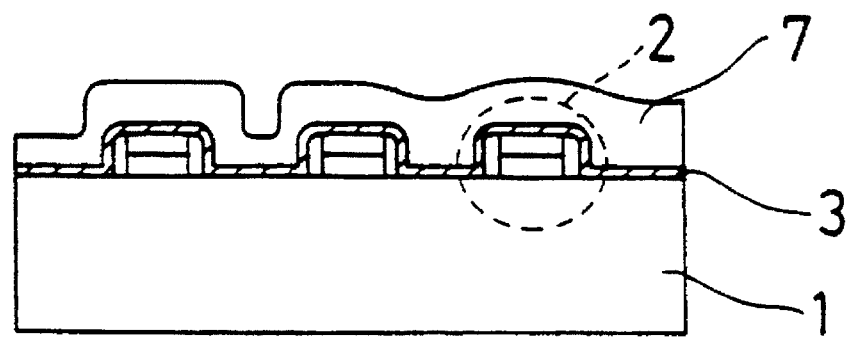

Then, as shown in FIG. 6 (b), the fluorine ion, indicated by reference numeral 8, is doped into the BPSG film 6 by means of an ion implantation process. A desired region can be doped with the fluorine ion 8 using a photoresist 9 having a corresponding opening to the desired region, although the entire doping is possible. In this case, a known photolithography technique or ion implantation technique may be used.

Following the above step, the implanted fluorine ion 8 is diffused within a matrix of the BPSG film 6 by means of low-temperature thermal processing so that part of the oxygen atoms of the dielectric film matrix is replaced by the fluorine atoms (FIG. 6 (c)). The BPSG film 6 now changes to a film of FBPSG 7 having a structure shown in FIG. 4 and flows at a lower temperature.

Like the first embodiment, part of the oxygen atoms is replaced with fluorine atoms so that the matrix network bond is locally broken and the flow temperature of the dielectric film falls. Further, it is possible, with using a mask, to selectively dope the BPSG film 6 with fluorine ions to form the FBPSG film 7 at different, desired regions.

Figure 7:
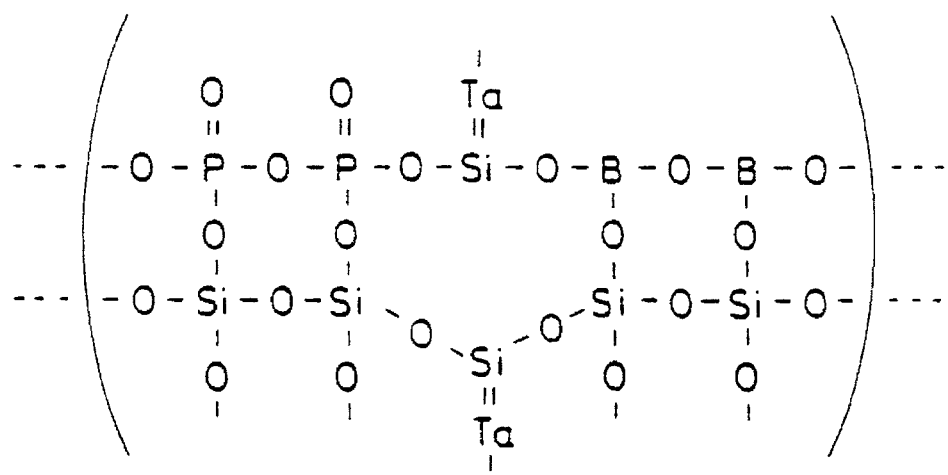
FIG. 7 shows the structure of a matrix, with an oxygen atom of a BPSG film replaced by a tantalum atom.
Figure 8:
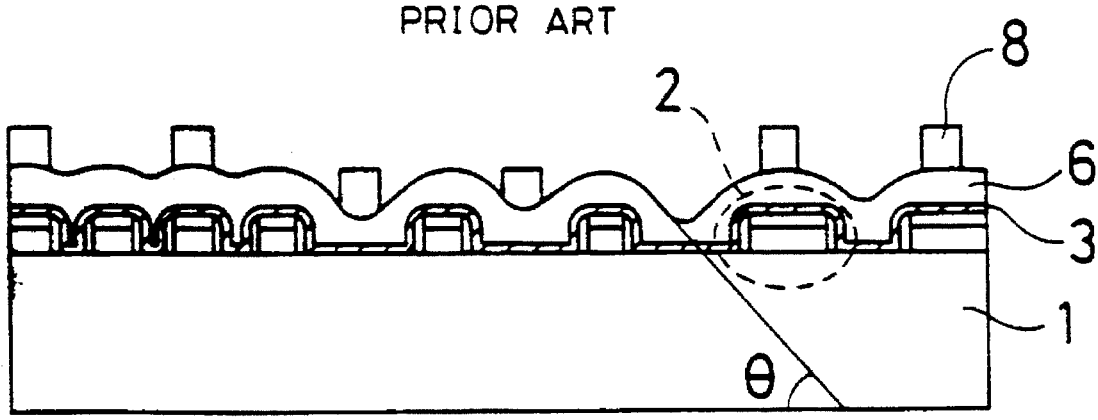
FIG. 8 illustrates, in cross section, the organization of a conventional semiconductor device.

The non-bridging constituent is not limited only to halogen such as fluorine. Other feasible non-bridging constituents are Ta, Hf, and V. Even in the case that the atom of Ta, Hf, or V forms a bond to the atom of Si in a matrix, it double-bonds to the silicon atom to reduce the number of bonding positions of the S1 atom by one, thereby breaking part of the matrix network structure. FIG. 7 shows a structure example where an atom of Ta replaces an atom of oxygen, from which it is seen that part of the matrix network structure is broken at a position where the number of Si atom bonds is reduced. Approximately the same effect can be obtained in the case of using V or Hf.

Further, the dielectric film matrix is not limited only to a silicon dioxide film ($SiO_2$). The feasible are a film of germanium dioxide ($GeO_2$), a film of silicon nitride ($Si_3N_4$) in which an atom of silicon serves as a main constituent while an atom of nitrogen serves as a sub-constituent, $R_2O$ $B_2O_3$ in which boron or sodium having a valence of one is a main constituent while oxygen is a sub-constituent, and lead glass. By substituting these sub-constituents with non-bridging constituents such as a halogen atom, the same effect can be expected.

The application of a dielectric film according to this invention is not limited only to an interlayer dielectric film. It may find use in uppermost dielectric films used for final coverage over the entire substrate. If it is applied to a dielectric film especially requiring planarization, the temperature of flow falls and the degree of planarization can be improved.

It is understood that various other modifications to the above-described method and device will become evident to those skilled in the art. For that reason the arrangement described herein is for illustrative purposes only and is not to be considered restrictive.

The invention claimed is:

1. A method of fabricating a semiconductor comprising a silicon oxide film having a matrix network on a semiconductor substrate, the method comprising the steps of:

depositing a solidified substance of a source gas onto the semiconductor substrate by means of a CVD process wherein the source gas comprises a main gas for forming the silicon oxide film and an additive gas obtained by substituting at least one of hydrogen in monosilane by fluorine; and subjecting the solidified substance to thermal processing;

whereby the silicon oxide film is formed on the semiconductor substrate in which the matrix network is partially cut off by substitution of oxygen by fluorine.

2. A method of fabricating a semiconductor device as in claim 1, wherein the main gas contains monosilane gas and oxygen gas.

3. A method of fabricating a semiconductor device as in claim 1, wherein the dielectric film is an interlayer dielectric film.

4. A method of fabricating a semiconductor device as in claim 1, wherein the step of depositing the solidified substance of the source gas onto the semiconductor substrate and the step of subjecting the thus deposited solidified substance to thermal processing are simultaneously carried out.

5. A method of fabricating a semiconductor device as in claim 1, wherein the principal ingredient of the source gas is chosen from among $SiH_2F_2$, $SiH_2Cl_2$, $SiH_3F$, and $SiH_3Cl$.

6. A method of fabricating a semiconductor device as in claim 1, the source gas is doped with a phosphorus source gas as a sub-ingredient thereof.

7. A method of fabricating a semiconductor device as in claim 1, the source gas is doped with a boron source gas as a sub-ingredient thereof.

8. A method of fabricating a semiconductor device as in claim 1, the source gas is doped with an arsenic source gas as a sub-ingredient thereof.

9. A method of fabricating a semiconductor device comprising a semiconductor substrate and a dielectric film arranged upon the semiconductor substrate wherein the dielectric film has a matrix network formed by a main constituent composed of at least one type of chemical element and a sub-constituent composed of at least one type of chemical element, the method comprising the steps of:

depositing the dielectric film on the substrate;

selectively doping the dielectric film with fluorine ions using a mask; and subjecting the doped dielectric film to thermal processing, whereby the dielectric film is deposited with its matrix network partially broken due to the replacement by the fluorine ions.

10. A method of fabricating a semiconductor device as in claim 9, wherein:

the main constituent is composed of a silicon atom;

the sub-constituent is composed of an oxygen atom; and the matrix of the dielectric film is composed of a film of silicon dioxide formed by bonds between the silicon atoms and the oxygen atoms in a network fashion.

11. A method of fabricating a semiconductor device as in claim 10, further including the step of replacing part of the main constituent of the matrix of the dielectric film with phosphorus atoms.

12. A method of fabricating a semiconductor device as in claim 10, further including the step of replacing part of the main constituent of the matrix of the dielectric film with boron atoms.

13. A method of fabricating a semiconductor device as in claim 10, further including the step of replacing part of the main constituent of the matrix of the dielectric film with arsenic atoms.

14. A method of fabricating a semiconductor device as in claim 9, wherein the dielectric film is an interlayer dielectric film.

* * * * *